United States Patent
Cheng et al.

(10) Patent No.: US 10,636,887 B2
(45) Date of Patent: Apr. 28, 2020

(54) SELF-LIMITING FIN SPIKE REMOVAL

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/521,774

(22) Filed: Jul. 25, 2019

(65) Prior Publication Data

US 2019/0348512 A1  Nov. 14, 2019

Related U.S. Application Data

(63) Continuation of application No. 15/890,671, filed on Feb. 7, 2018, now Pat. No. 10,431,660.

(51) Int. Cl.

| | |
|---|---|
| *H01L 21/00* | (2006.01) |
| *H01L 29/417* | (2006.01) |
| *H01L 29/66* | (2006.01) |
| *H01L 21/762* | (2006.01) |
| *H01L 21/324* | (2006.01) |
| *H01L 21/8234* | (2006.01) |
| *H01L 29/78* | (2006.01) |
| *H01L 29/10* | (2006.01) |

(52) U.S. Cl.
CPC ...... *H01L 29/41791* (2013.01); *H01L 21/324* (2013.01); *H01L 21/76229* (2013.01); *H01L 21/823431* (2013.01); *H01L 29/1054* (2013.01); *H01L 29/6681* (2013.01); *H01L 29/66795* (2013.01); *H01L 29/785* (2013.01); *H01L 29/7851* (2013.01)

(58) Field of Classification Search
CPC ............ H01L 21/324; H01L 21/76229; H01L 29/823431; H01L 29/41791; H01L 29/6681; H01L 21/32105; H01L 21/32139; H01L 21/0273; H01L 21/32134; H01L 29/0657
See application file for complete search history.

(56) References Cited

U.S. PATENT DOCUMENTS

| | | |
|---|---|---|
| 8,461,008 B2 | 6/2013 | Cho |
| 8,617,996 B1 | 12/2013 | Chi et al. |
| 8,658,536 B1 | 2/2014 | Choi et al. |

(Continued)

OTHER PUBLICATIONS

Anonymous; "Method of deactivating partially cut end fins"; IPCOM000234148D; Jan. 14, 2014; 4 pages.

(Continued)

*Primary Examiner* — Ermias T Woldegeorgis
(74) *Attorney, Agent, or Firm* — Cantor Colburn LLP; Vazken Alexanian

(57) ABSTRACT

Provided is a method for forming a semiconductor structure. In embodiments of the invention, the method includes laterally forming a spacer on a side of the semiconductor structure. The method further includes performing a thermal anneal on the semiconductor structure. The method further includes performing an etch to remove materials formed by the thermal anneal.

20 Claims, 19 Drawing Sheets

(56) References Cited

U.S. PATENT DOCUMENTS

| | | |
|---|---|---|
| 8,753,940 B1 | 6/2014 | Wei et al. |
| 8,846,490 B1 | 9/2014 | Shieh et al. |
| 8,906,807 B2 | 12/2014 | Bergendahl et al. |
| 9,263,340 B2 | 2/2016 | Taylor, Jr. et al. |
| 9,269,628 B1 | 2/2016 | Jacob |
| 9,337,050 B1 | 5/2016 | Xie et al. |
| 9,524,908 B2 | 12/2016 | Qi et al. |
| 9,722,024 B1 | 8/2017 | Xie et al. |
| 9,722,052 B2 | 8/2017 | Cheng et al. |
| 9,761,450 B1 | 9/2017 | Bi et al. |
| 2008/0081388 A1* | 4/2008 | Yasseri ............ B82Y 10/00 438/22 |
| 2013/0309838 A1 | 11/2013 | Wei et al. |
| 2014/0256144 A1 | 9/2014 | Lo et al. |
| 2015/0206954 A1 | 7/2015 | Lin |
| 2015/0279971 A1 | 10/2015 | Xie et al. |
| 2016/0133726 A1 | 5/2016 | Sung et al. |
| 2016/0284558 A1 | 9/2016 | Cheng et al. |
| 2017/0236722 A1* | 8/2017 | Fan ............ H01L 29/0657 257/623 |
| 2017/0250088 A1 | 8/2017 | Derderian |

OTHER PUBLICATIONS

Kangguo Cheng, et al."Self-Limiting Fin Spike Removal", U.S. Appl. No. 14/890,671, filed Feb. 7, 2018.

Kangguo Cheng, et al."Self-Limiting Fin Spike Removal", U.S. Appl. No. 16/521,777, filed Jul. 25, 2019.

List of IBM Patents or Patent Applications Treated as Related; (Appendix P), Date Filed Jul. 25, 2019; 2 pages.

Maszara et al.; "FinFETs—Technology and Circuit Design Challenges"; Proceedings of the 2013 IEEE European Solid-State Device Research Conference (ESSDERC), pp. 3-8 (2013).

Zhang et al.; "A Generalized Edge-Placement Yield Model for the Cut-Hole Patterning Process"; Proc. SPIE Advanced Lithography Symposium 90521, pp. 90521Q-1 to 90521Q-12 (2014).

\* cited by examiner

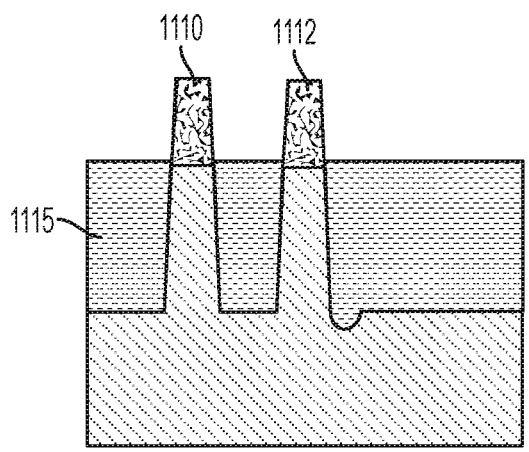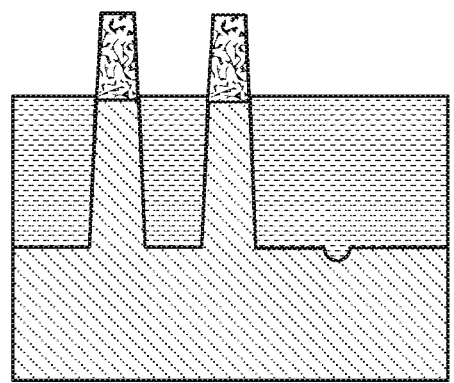
FIG. 18A
FIG. 18B

SELF-LIMITING FIN SPIKE REMOVAL

DOMESTIC PRIORITY

This application is a continuation of U.S. application Ser. No. 15/890,671, titled "SELF-LIMITING FIN SPIKE REMOVAL" filed Feb. 7, 2018, the contents of which are incorporated by reference herein in its entirety

BACKGROUND

The present invention relates in general to field effect transistors (FETs). More specifically, the present invention relates to FETs with improved fin construction.

Integrated circuit devices are a set of electronic circuits on one small chip of semiconductor material. A typical integrated circuit device includes many transistors. As feature sizes have become smaller, different types of transistor architectures have been developed. Among the newer types of transistor architectures is the fin-type field effect transistor (FinFET).

SUMMARY

One or more embodiments of the invention provide a method for forming a semiconductor structure. In embodiments of the invention, the method includes laterally forming a spacer on a side of the semiconductor structure. The method further includes performing a thermal anneal on the semiconductor structure. The method further includes performing an etch to remove materials formed by the thermal anneal.

One or more embodiments of the invention provide a semiconductor structure. The semiconductor structure includes a substrate. The semiconductor structure further includes one or more fin regions contacting the substrate and extending in a first direction. The structure further includes a shallow trench isolation region contacting the substrate and between the one or more fin regions. The fin region is formed by laterally forming a spacer on a side of the semiconductor structure. The method further includes performing a thermal anneal on the semiconductor structure. The method further includes performing an etch to remove materials formed by the thermal anneal.

One or more embodiments of the invention provide a semiconductor structure. The semiconductor structure includes a substrate. The semiconductor structure further includes one or more fin regions each overlaying a strain relief buffer region contacting the substrate and extending in a first direction. The structure further includes a shallow trench isolation region contacting the substrate and between the one or more fin regions. The fin region is formed by laterally forming a spacer on a side of the semiconductor structure, in a direction perpendicular to a substrate of the semiconductor. The method further includes performing a thermal anneal on the semiconductor structure. The method further includes performing an etch to remove materials formed by the thermal anneal.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

FIG. 18A depicts a cross-sectional view of the semiconductor structure after a processing operation according to one or more embodiments of the present invention;

FIG. 18B depicts a cross-sectional view of the semiconductor structure after a processing operation according to one or more embodiments of the present invention;

DETAILED DESCRIPTION

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
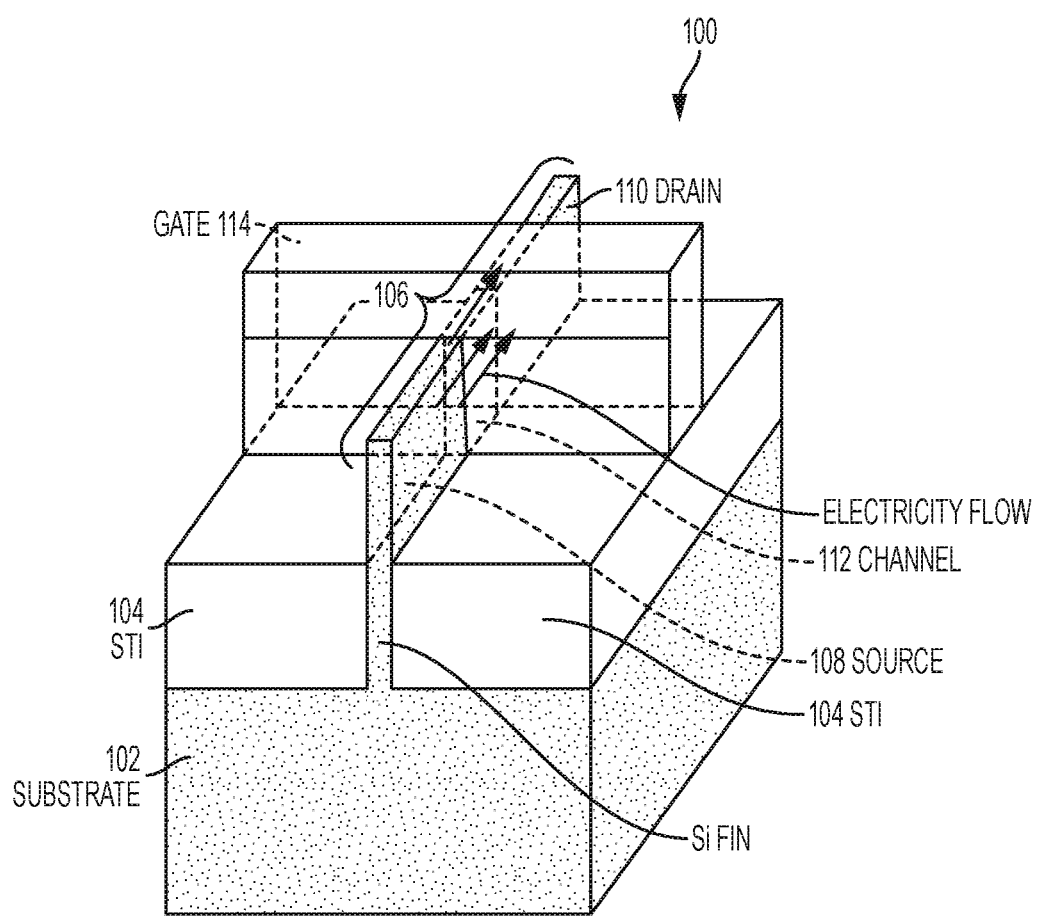
FIG. 1 depicts a cross-sectional view of a standard fin-type field effect transistor.

One particularly advantageous type of MOSFET is known generally as a fin-type field effect transistor (FinFET). A three-dimensional view of an exemplary FinFET 100 is shown in FIG. 1. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, and STI 104 can be an oxide (e.g., $SiO_2$). Fin 106 can be silicon that has been enriched to a desired concentration level of germanium. Gate 114 controls the source to drain current flow (labeled ELECTRICITY FLOW in FIG. 1). In contrast to a planar MOSFET, however, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

The semiconductor substrate 102 can be, for example, a bulk semiconductor material such as silicon, or a semiconductor-on-insulator (SOI) substrate including a handle substrate, a buried insulator layer, and a top semiconductor layer. In some embodiments of the invention, the substrate can include a semiconductor material, such as, for example, Si, Ge, SiGe, SiC, SiGeC, and III/V compound semiconductors. The substrate can provide mechanical support to the fin, STI, and other layers. The thickness of the substrate can be, for example, from 30 µm to about 2 mm.

Turning now to a more detailed description of technologies that are more specifically relevant to aspects of embodiments of the present invention, an issue that can occur during semiconductor fabrication is that lithography overlay can result in portions of a fin remaining after fin cut patterning. If you performed an isotropic etch to remove the portion of the fin, an intact fin could be weakened. Current FinFET technology requires removal of fins from the region where no fins are desired so that fins are formed only in the regions where they needed. A fin cut mask is applied to remove the undesired fins. However, due to the inherent variation of lithography process, the fin removal process will become extremely challenging to precisely place the mask relative to the fin patterns, especially for closely packed fins. An excessive misalignment of the fin cut mask to the fins will result in either an incomplete removal of unwanted fins, or a partial removal of the actual device fins. Both can result in a yield issue.

Figure 2A:
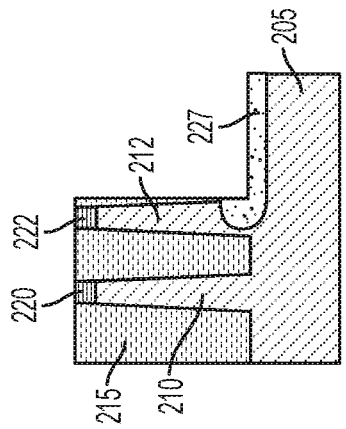
FIG. 2A depicts a cross-sectional view of a semiconductor with a partial fin.
Figure 2B:
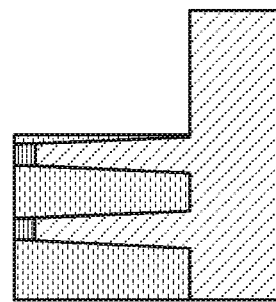
FIG. 2B depicts a cross-sectional view of a semiconductor after a processing operation.
Figure 2C:
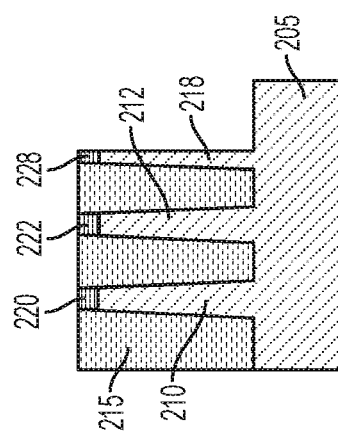
FIG. 2C depicts a cross-sectional view of a semiconductor after a processing operation.

FIGS. 2A through 2C illustrate the above-described issue. In FIG. 2A, a portion of a semiconductor wafer is shown in a cross-sectional view. Atop substrate 205 are fins 210 and 212 and shallow trench isolation (STI) layer 215. Atop fins 210 and 212 are hard masks 220 and 222, respectively. At the right side of the semiconductor wafer is a partial fin 218 and partial hard mask 228. FIG. 2B illustrates the same wafer after a processing step has been performed. An etch is performed to remove partial fin 218 and partial hard mask 228. The result is shown in FIG. 2C—the etch has damaged a portion of fin 212 (portion 227). Because of the defect seen in FIG. 2C, portions of the semiconductor wafer (or even the entire semiconductor wafer) could be rendered unusable.

Turning now to an overview of one or more embodiments of the invention, the use of a thermal anneal process on a spacer material in an oxygen-free environment is presented. In one or more embodiments of the invention, the resulting structure can feature no partial fins, with no weakening of the remaining fins. Methods for forming a semiconductor structure and semiconductor structures in accordance with embodiments of the invention are described in detail below by referring to the accompanying drawings in FIGS. 3-19B.

Figure 3:
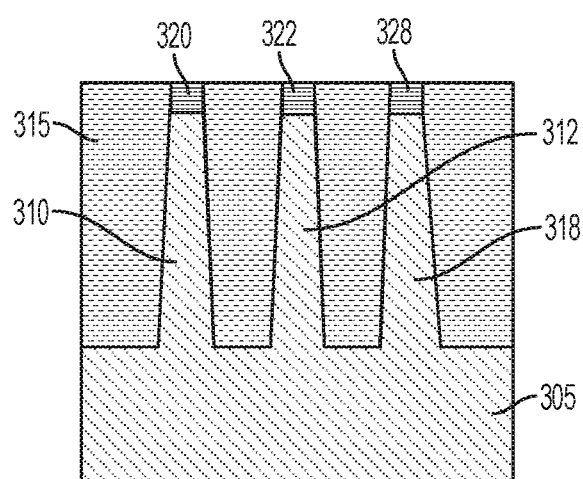
FIG. 3 depicts a cross-sectional view of the semiconductor structure.

FIG. 3 depicts a cross-sectional view of a semiconductor structure after a processing operation according to one or more embodiments of the invention. As depicted in FIG. 3, the semiconductor structure can include a substrate 305.

Substrate 305 can be silicon. Fins 310 and 312 are formed on substrate 305. Fins 310 and 312 can be formed of a silicon germanium (SiGe) material. A hard mask 320 and 322 are placed on fins 310 and 312, respectively. Thereafter, an STI layer 315 is deposited to cover the fins 310 and 312 and hard mask 320 and 322. Thereafter a chemical mechanical polish (CMP) is performed to remove the extra STI material and stop on top of the fin hard mask.

The hard mask layer 320 (and 322) can include an oxide, nitride, oxynitride or any combination thereof including multilayers. In some embodiments of the invention, the hard mask layer 320 (and 322) can include silicon oxide or silicon nitride. The hard mask layer 320 (and 322) can be formed utilizing a deposition process such as, for example, chemical vapor deposition (CVD), plasma enhanced chemical vapor deposition (PECVD), chemical solution deposition, evaporation. In some embodiments of the invention, the hard mask layer 320 (and 322) can be formed by a thermal process such as, for example, oxidation or nitridation of the top semiconductor layer. Any combination of the above mentioned processes can also be used in forming the hard mask layer 320 (and 322). The hard mask layer 320 (and 322) can have a thickness from 20 nm to 80 nm, for example, from 30 nm to 60 nm.

At the right side of the figure is a fin 318 and corresponding hard mask layer 328. In some embodiments, fin 318 can be partially cut off. In some embodiments, fin 318 otherwise can be judged unusable. Therefore, fin 318 and hard mask 328 can be subject to removal.

Figure 4A:
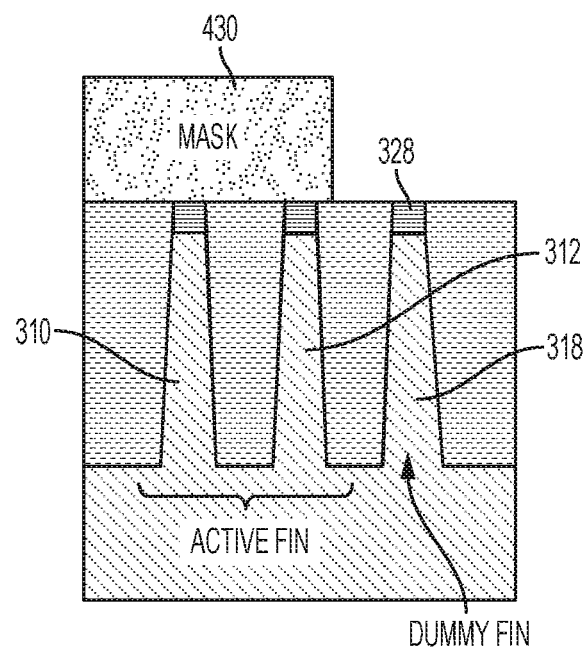
FIG. 4A depicts a cross-sectional view of the semiconductor structure after a processing operation according to one or more embodiments of the present invention.
Figure 4B:
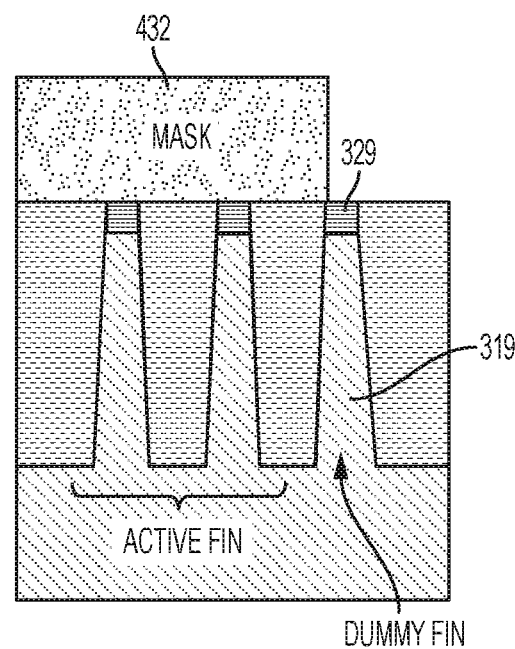
FIG. 4B depicts a cross-sectional view of the semiconductor structure after a processing operation according to one or more embodiments of the present invention.

FIGS. 4A and 4B depict a cross-sectional view of a semiconductor structure after a processing operation according to one or more embodiments of the invention. In FIGS. 4A and 4B, two separate cases are shown. The cases are similar to those shown in FIG. 3, with the addition of a mask. In FIG. 4A, mask 430 is deposited over fins 310 and 312, with fin 318 uncovered by mask 430. In FIG. 4B, mask 432 is deposited over fins 310 and 312 and partially deposited over fin 319. Due to the small distance between the fins 310, 312, and 319, it is not always possible to exactly place deposit mask 430 or 432. So two different possibilities are illustrated in FIGS. 4A and 4B. This condition also can be referred to as an overlay condition, because mask 432 is partially overlaying fin 319.

Mask 430 and 432 can be constructed of one of a variety of different materials. In some embodiments, mask 430 and 432 can be a soft mask (such as a photoresist) or a hard mask (such as a silicon oxide or a silicon nitride).

Figure 5A:
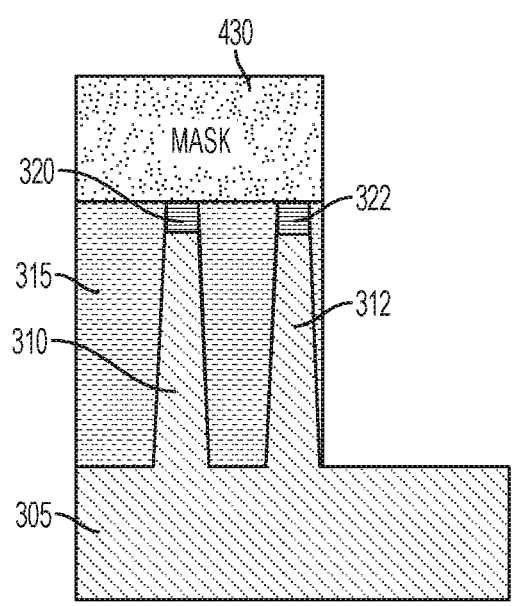
FIG. 5A depicts a cross-sectional view of the semiconductor structure after a processing operation according to one or more embodiments of the present invention.
Figure 5B:
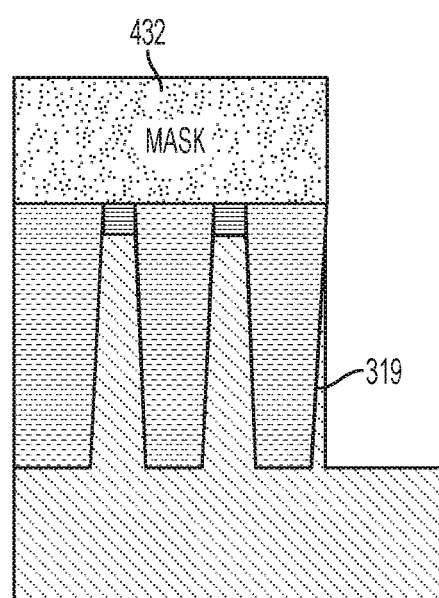
FIG. 5B depicts a cross-sectional view of the semiconductor structure after a processing operation according to one or more embodiments of the present invention.

FIGS. 5A and 5B depict a cross-sectional view of the semiconductor structure after a processing operation according to one or more embodiments of the invention. The structure resulting from a reactive ion etch (RIE) is illustrated in FIGS. 5A and 5B. The RIE is configured to remove any structure above the substrate 305 that is not covered by mask 430 or mask 432. In FIG. 5A, the entire fin 318 is removed (which was present in FIG. 4A). In FIG. 5B, only a portion of fin 319 remains.

Figure 6A:
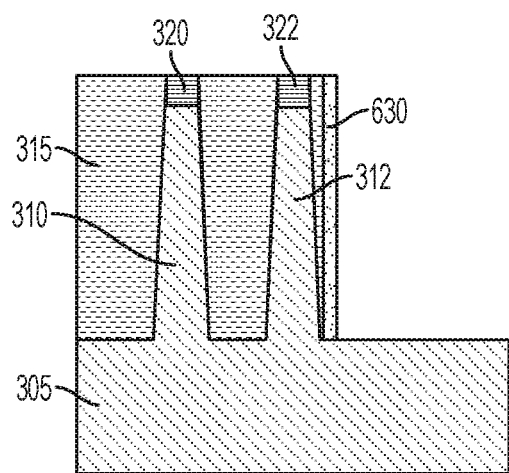
FIG. 6A depicts a cross-sectional view of the semiconductor structure after a processing operation according to one or more embodiments of the present invention.
Figure 6B:
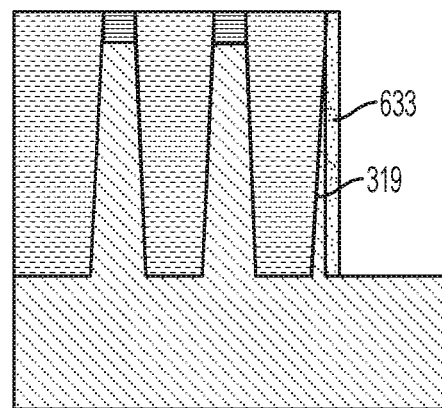
FIG. 6B depicts a cross-sectional view of the semiconductor structure after a processing operation according to one or more embodiments of the present invention.

FIGS. 6A and 6B depict a cross-sectional view of the semiconductor structure after a processing operation according to one or more embodiments of the invention. A germanium oxide ($GeO_2$) spacer is laterally formed along the side of the structure. The formation can occur in one of a variety of different manners known in the art, such as conformal thin film deposition (e.g., using ALD), possibly followed by a directional RIE. In FIG. 6A, $GeO_2$ spacer 630 is in contact with STI layer 315. In FIG. 6B, $GeO_2$ spacer 633 is illustrated as contacting a portion of dummy fin 319. The thickness of $GeO_2$ spacer 630 and 633 has a self-limiting modification on the SiGe in the lateral direction.

Figure 7A:
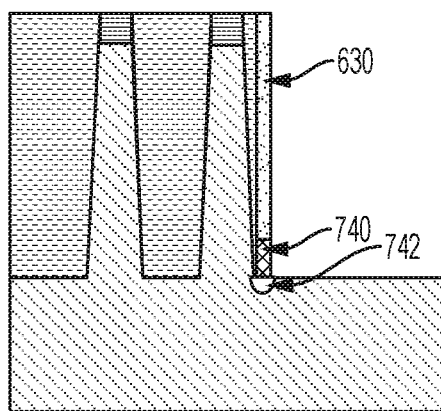
FIG. 7A depicts a cross-sectional view of the semiconductor structure after a processing operation according to one or more embodiments of the present invention.
Figure 7B:
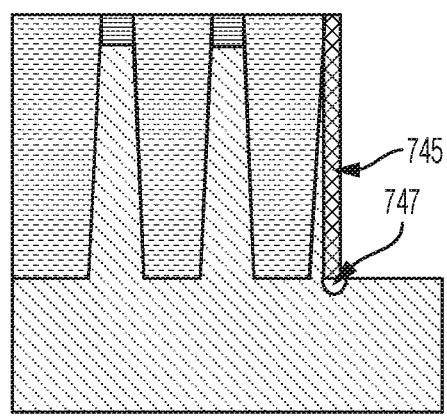
FIG. 7B depicts a cross-sectional view of the semiconductor structure after a processing operation according to one or more embodiments of the present invention.

FIGS. 7A and 7B depict a cross-sectional view of the semiconductor structure after a processing operation according to one or more embodiments of the invention. A thermal anneal is performed in a no oxygen environment (e.g., in a nitrogen environment or in an inert gas environment). The silicon in the SiGe channel reacts with the germanium oxide to form silicon oxide ($SiO_2$).

In FIG. 7A, the $GeO_2$ spacer (630 and 633) reacts to the thermal anneal, resulting in an area of silicon oxide ($SiO_2$) 740 at the bottom, above an area of silicon germanium (SiGe) with a high percentage of germanium (742). The remainder of the $GeO_2$ remains as reference 630. In contrast, in FIG. 7B, the SiGe of fin 317 reacts to turn the SiGe into silicon oxide 745. The remainder (747) is silicon germanium with a high percentage of germanium.

Figure 19A:
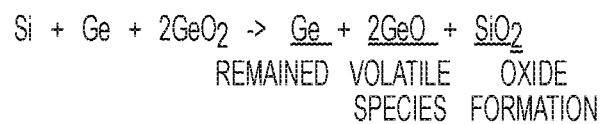
FIG. 19A depicts a chemical equation according to one or more embodiments of the present invention.
Figure 19B:
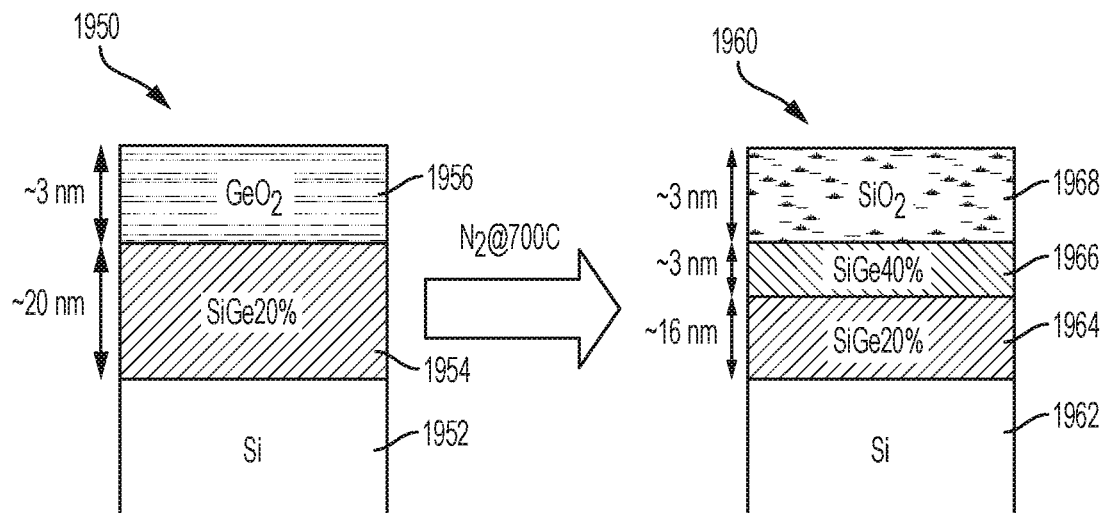
FIG. 19B depicts a cross-sectional view of an exemplary chemical reaction according to one or more embodiments of the present invention.

The chemistry behind this reaction is shown in FIG. 19A-19B. Silicon in an area of SiGe is selectively oxidized due to the lower Gibbs free energy. The chemical equation is shown in FIG. 19A, as silicon and germanium added to germanium oxide (when in a thermal anneal performed in an oxygen-free environment) results in germanium, volatile species germanium oxide, and silicon oxide. In embodiments of the invention, the above-described reaction process can be well-controlled, as the reaction of $GeO_2$ with the SiGe only occurs during the anneal, which can, in some embodiments be a spike anneal at a temperature of from about 450 to about 700 degrees Celsius, depending on the Ge concentration in the SiGe. At these temperatures, there is no reaction of the $GeO_2$ with pure silicon, STI or hardmask material. Accordingly, the annealing method of the present invention is highly selective to SiGe. During the thermal anneal process, the reaction of $GeO_2$ with SiGe selectively oxidizes silicon in the exposed SiGe region and condenses germanium in the remaining SiGe according to the reaction described in FIG. 19A. As the reaction proceeds, more Si in the SiGe region is oxidized to $SiO_2$, and the surface of the SiGe portion is continuously enriched with more germanium.

FIG. 19B illustrates an exemplary process performed on a structure 1950. Structure 1950 includes a layer 1952 of silicon, a layer 1954 of silicon germanium (with a 20 percent concentration of germanium), and a layer 1956 of germanium oxide. As shown in the illustration, layer 1952 is approximately 20 nm thick while layer 1954 is approximately 3 nm thick.

Structure 1950 is subjected to a thermal anneal at a temperature between about 450 to about 700 degrees Celsius, depending on the Ge concentration in the SiGe, in a nitrogen atmosphere. While a nitrogen atmosphere is shown for illustrative purposes, it should be understood that hydrogen can be used in some embodiments. In other embodiments, an inert gas, such as argon, or mixture of gases also can be used.

After the thermal anneal is performed, the result is structure 1960. Structure 1960 includes a layer 1962 of silicon. Atop layer 1962 is a layer 1964 of silicon germanium (with a 20 percent concentration of germanium), followed by a layer 1966 silicon germanium (with a 40 percent concentration of germanium), followed by a layer 1968 of silicon oxide. The thickness of layer 1964 is approximately 16 nm, the thickness of layer 1966 is approximately 3 nm, and the thickness of layer 1968 is approximately 3 nm. The non-reacted $GeO_2$ is water soluble, so can easily be removed with a water solution, such as de-ionized water.

Figure 8A:
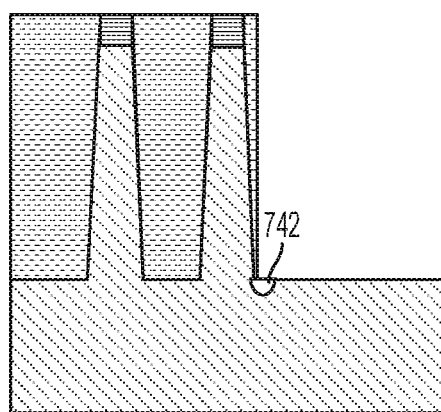
FIG. 8A depicts a cross-sectional view of the semiconductor structure after a processing operation according to one or more embodiments of the present invention.
Figure 8B:
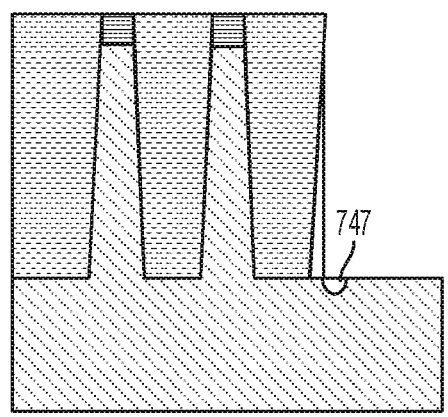
FIG. 8B depicts a cross-sectional view of the semiconductor structure after a processing operation according to one or more embodiments of the present invention.

FIGS. 8A and 8B depict a cross-sectional view of the semiconductor structure after a processing operation according to one or more embodiments of the invention. An isotropic etch is performed of the silicon oxide (740 and 745 of FIGS. 7A and 7B) formed by the $GeO_2$ reaction. The isotropic etch could be, for example, a hydrofluoric acid wet etch or dry etch. The remaining $GeO_2$ is stripped by water, leaving just areas 742 and 747 containing silicon germanium with a high percentage of germanium, compared to that of original SiGe.

Figure 9A:
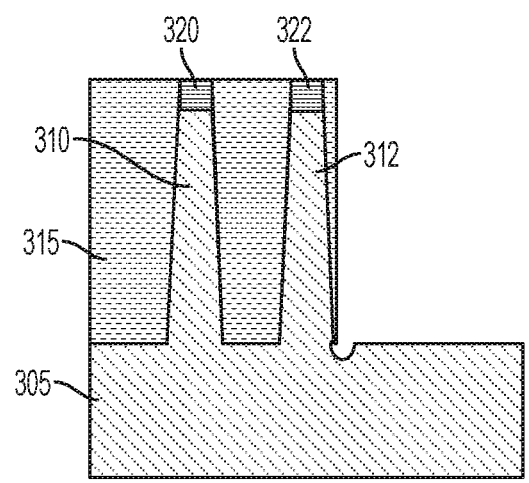
FIG. 9A depicts a cross-sectional view of the semiconductor structure after a processing operation according to one or more embodiments of the present invention.
Figure 9B:
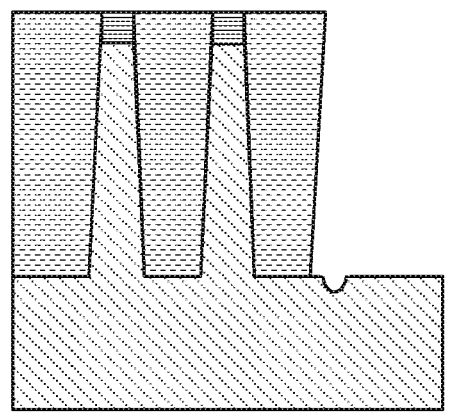
FIG. 9B depicts a cross-sectional view of the semiconductor structure after a processing operation according to one or more embodiments of the present invention.

FIGS. 9A and 9B depict a cross-sectional view of the semiconductor structure after a processing operation according to one or more embodiments of the invention. Areas 742 and 747 of FIGS. 8A and 8B are removed. This can be performed in one of a variety of different manners. For example, an isotropic etch such as gas phase etch, plasma etch, or wet etch. For example, in the case where SiGe fins comprise $Si_{80}Ge_{20}$, the isotropic etch selectively removes the as formed high Ge % (i.e., $Si_{60}Ge_{40}$) sacrificial layers relative to the low Ge % (i.e., $Si_{80}Ge_{20}$) fin layer. In one embodiment, the high Ge % SiGe etch process includes gas phase hydrogen fluoride etch, a wet etch process containing a mix of ammonia and hydrogen peroxide, a dry etch such as plasma etch.

Figure 10A:
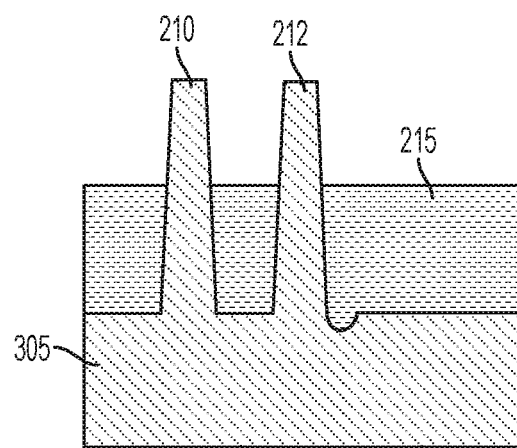
FIG. 10A depicts a cross-sectional view of the semiconductor structure after a processing operation according to one or more embodiments of the present invention.
Figure 10B:
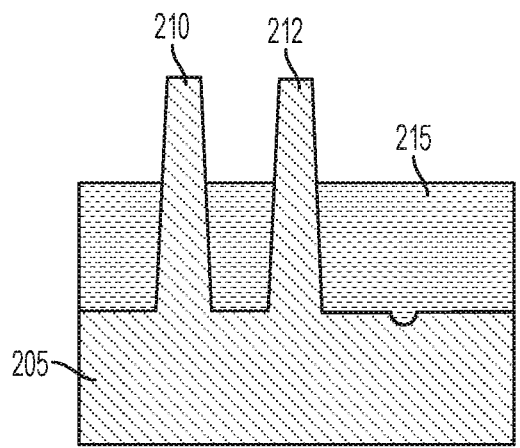
FIG. 10B depicts a cross-sectional view of the semiconductor structure after a processing operation according to one or more embodiments of the present invention.

FIGS. 10A and 10B depict a cross-sectional view of the semiconductor structure after a processing operation according to one or more embodiments of the invention. Above substrate 205, an etch is performed to remove the hard mask (220 and 222). A fill is performed to add to shallow trench isolation (STI) layer 215 to the areas removed in earlier steps. In addition, a recess can be performed to partially remove portions of STI layer 215, exposing fins 210 and 212. From this point, traditional semiconductor processing steps can be performed to finish the semiconductor device fabrication.

Figure 11:
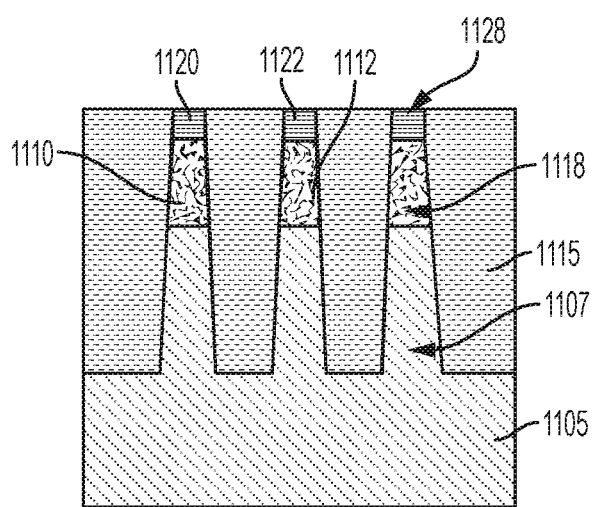
FIG. 11 depicts a cross-sectional view of the semiconductor structure after a processing operation according to one or more embodiments of the present invention.

FIG. 11 depicts an alternative embodiment of the above described process. As opposed to the uniform silicon germanium fin depicted in FIGS. 3 through 10B, the fin in FIGS. 11 through 18B include a silicon germanium (SiGe) strain relaxed buffer (SRB) layer that is above a silicon substrate. Thereafter, a silicon fin is grown over the SRB layer.

As depicted in FIG. 11, the semiconductor structure can include a substrate 1105. Silicon fins 1110, 1112, and 1118 are each formed on an SRB layer 1107. Thereafter, an STI layer 1115 is used to fill the region between fins 1110, 1112, 1118, and the respective SRB layers 1107. Hard mask layers 1120, 1122, and 1128 are atop fins 1110, 1112, and 1118, respectively. Thereafter a chemical mechanical polish (CMP) is performed.

Figures 12A, 12B:
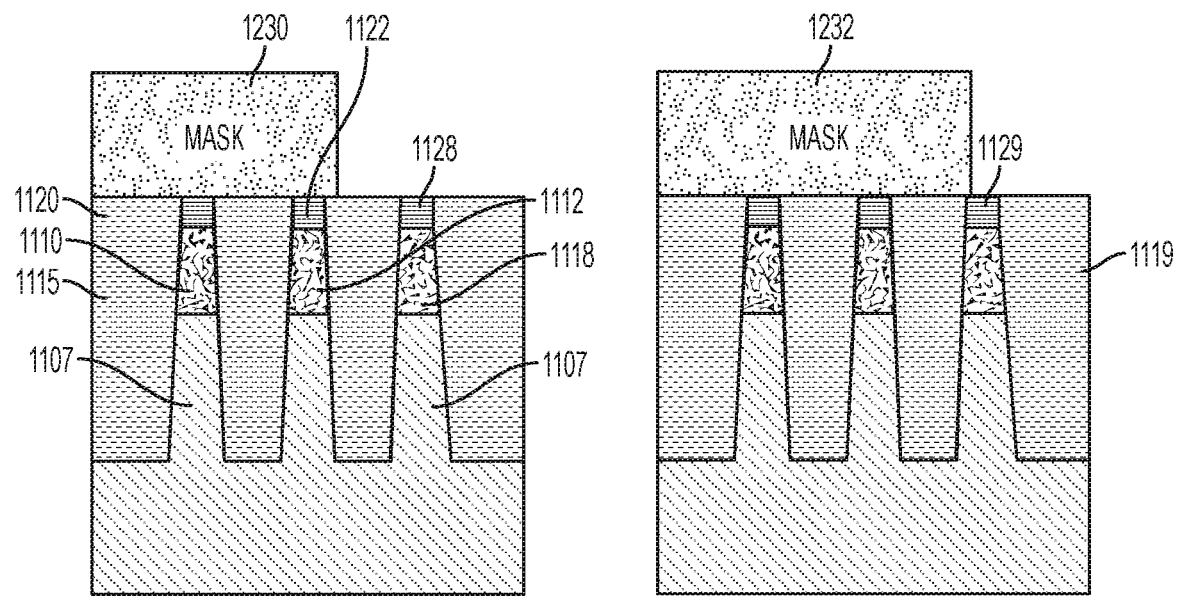
FIG. 12A depicts a cross-sectional view of the semiconductor structure after a processing operation according to one or more embodiments of the present invention.
FIG. 12B depicts a cross-sectional view of the semiconductor structure after a processing operation according to one or more embodiments of the present invention.

FIGS. 12A and 12B depict a cross-sectional view of the semiconductor structure after a processing operation according to one or more embodiments of the invention. In FIGS. 12A and 12B, two separate cases are shown. The cases are similar to those shown in FIG. 11, with the addition of a mask. In FIG. 12A, mask 1230 is deposited over fins 1110 and 1112, with fin 1118 uncovered by mask 1230. In FIG. 12B, mask 1232 is deposited over fins 1110 and 1112 and partially deposited over fin 1119.

Figure 13A:
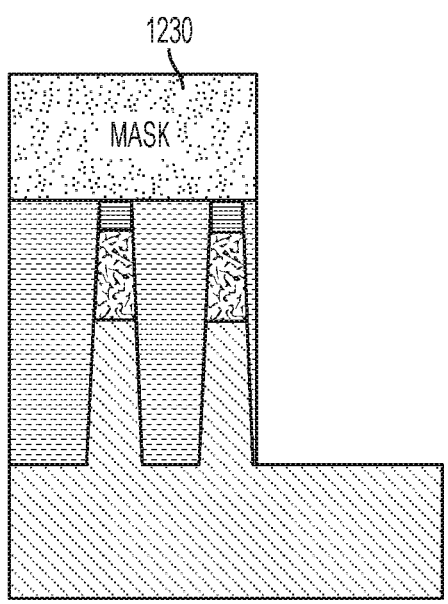
FIG. 13A depicts a cross-sectional view of the semiconductor structure after a processing operation according to one or more embodiments of the present invention.
Figure 13B:
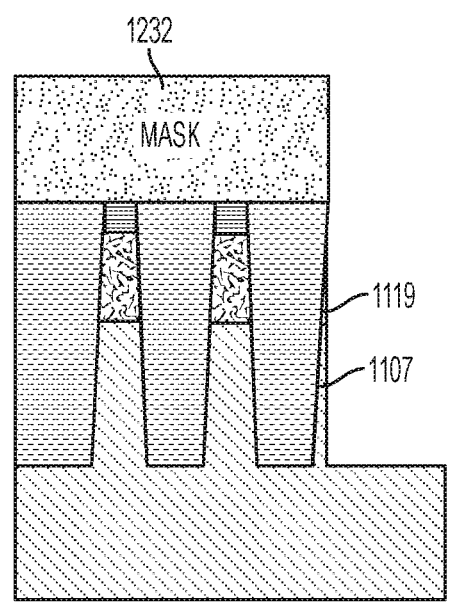
FIG. 13B depicts a cross-sectional view of the semiconductor structure after a processing operation according to one or more embodiments of the present invention.

FIGS. 13A and 13B depict a cross-sectional view of the semiconductor structure after a processing operation according to one or more embodiments of the invention. The structure resulting from a reactive ion etch (RIE) is illustrated in FIGS. 13A and 13B. The RIE is configured to remove any structure above the substrate 1105 that is not covered by mask 1230 or mask 1232. In FIG. 13A, the entire fin 1118 is removed. In FIG. 13B, a portion of fin 1119 remains.

Figure 14A:
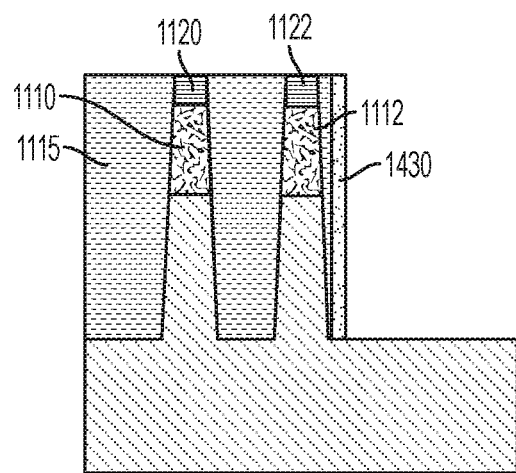
FIG. 14A depicts a cross-sectional view of the semiconductor structure after a processing operation according to one or more embodiments of the present invention.
Figure 14B:
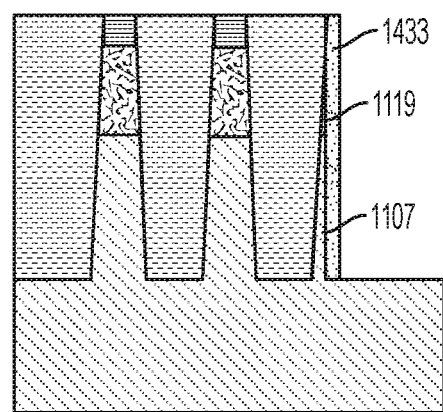
FIG. 14B depicts a cross-sectional view of the semiconductor structure after a processing operation according to one or more embodiments of the present invention.

FIGS. 14A and 14B depict a cross-sectional view of the semiconductor structure after a processing operation according to one or more embodiments of the invention. A germanium oxide ($GeO_2$) spacer is laterally formed along the side of the structure. The formation can occur in one of a variety of different manners known in the art, such as conformal thin film deposition(e.g., using ALD), possibly followed by a directional RIE to remove the germanium oxide layer on horizontal surfaces. In FIG. 14A, $GeO_2$ spacer 1430 is in RIE 1115, shown close to fin 1112. In FIG. 14B, $GeO_2$ spacer 1433 is illustrated as contacting a portion of dummy fin 1119. The =$GeO_2$ spacer 1430 and 1433 has a self-limiting modification on the SiGe in the lateral direction as well as on the top surface portion of the adjacent SiGe in the vertical direction.

Figure 15A:
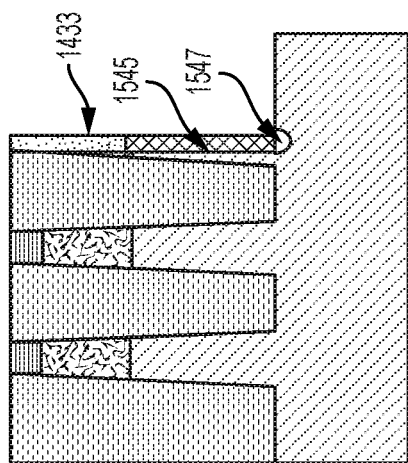
FIG. 15A depicts a cross-sectional view of the semiconductor structure after a processing operation according to one or more embodiments of the present invention.
Figure 15B:
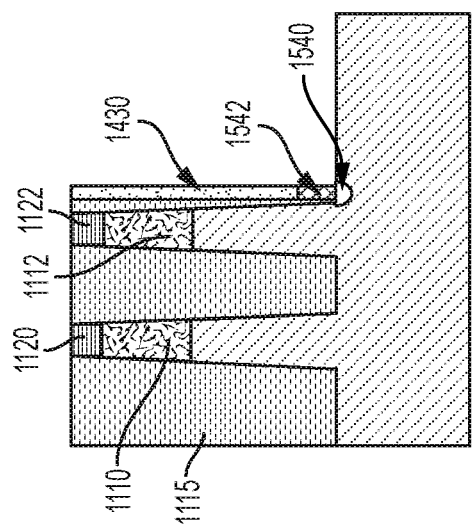
FIG. 15B depicts a cross-sectional view of the semiconductor structure after a processing operation according to one or more embodiments of the present invention.

FIGS. 15A and 15B depict a cross-sectional view of the semiconductor structure after a processing operation according to one or more embodiments of the invention. A thermal anneal is performed in a no oxygen environment (e.g., in a nitrogen environment or in an inert gas environment). The silicon in the SiGe is selectively oxidized, due to the lower Gibbs free energy, to form silicon oxide ($SiO_2$).

In FIG. 15A, the $GeO_2$ spacer (1430 and 1433) reacts to the thermal anneal, resulting in an area of silicon oxide ($SiO_2$) 1542 at the bottom, above an area of silicon germanium (SiGe) with a high percentage of germanium (1540). The remainder of the $GeO_2$ remains as reference 1430. In contrast, in FIG. 15B, the SiGe portion of fin 1119 reacts to turn the SiGe into silicon oxide 1545. There is no reaction between Si portion of the fin and the $GeO_2$ spacer and remains as reference 1433. The remainder (1547) is silicon germanium with a high percentage of germanium.

Figure 16A:
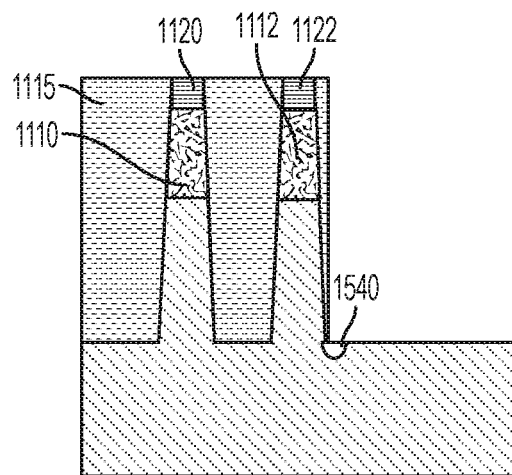
FIG. 16A depicts a cross-sectional view of the semiconductor structure after a processing operation according to one or more embodiments of the present invention.
Figure 16B:
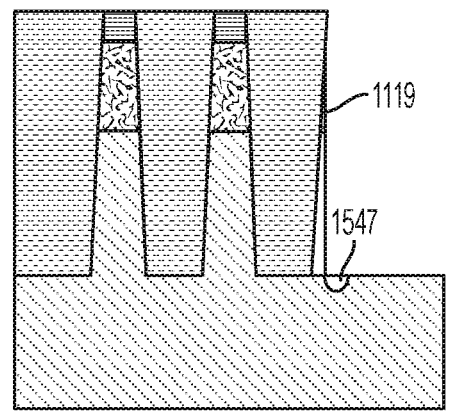
FIG. 16B depicts a cross-sectional view of the semiconductor structure after a processing operation according to one or more embodiments of the present invention.

FIGS. 16A and 16B depict a cross-sectional view of the semiconductor structure after a processing operation according to one or more embodiments of the invention. An isotropic etch is performed of the oxide (1540 and 1545 of FIGS. 15A and 15B) formed by the $GeO_2$ reaction. The remaining $GeO_2$ is stripped by water, leaving just areas 1542 and 1547 containing silicon germanium with a high percentage of germanium.

Figure 17A:
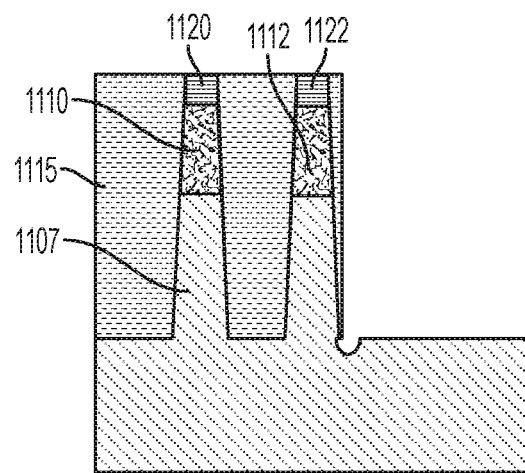
FIG. 17A depicts a cross-sectional view of the semiconductor structure after a processing operation according to one or more embodiments of the present invention.
Figure 17B:
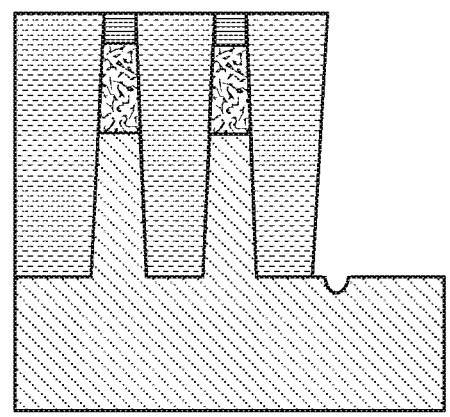
FIG. 17B depicts a cross-sectional view of the semiconductor structure after a processing operation according to one or more embodiments of the present invention.

FIGS. 17A and 17B depict a cross-sectional view of the semiconductor structure after a processing operation according to one or more embodiments of the invention. Areas 1542 and 1547 of FIGS. 15A and 15B are removed. This can be performed in one of a variety of different manners aforementioned.

FIGS. 18A and 18B depict a cross-sectional view of the semiconductor structure after a processing operation according to one or more embodiments of the invention. Above substrate 1105, an etch is performed to remove the hard mask (1120 and 1122). A fill is performed to add to shallow trench isolation (STI) layer 1115 to the areas removed in earlier steps. In addition, a recess can be performed to partially remove portions of STI layer 1115, exposing fins 1110 and 1112. From this point, traditional semiconductor processing steps can be performed to finish the semiconductor.

Various embodiments of the present invention are described herein with reference to the related drawings. Alternative embodiments can be devised without departing from the scope of embodiments of the present invention. It is noted that various connections and positional relationships (e.g., over, below, adjacent, etc.) are set forth between elements in the following description and in the drawings.

These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor structure, the method comprising:
   forming a fin on a substrate, the fin comprising silicon and germanium;
   forming a shallow trench isolation (STI) layer over the substrate and on a sidewall of the fin;
   forming a spacer comprising germanium oxide on the substrate, the spacer adjacent to the fin and in direct contact with the STI layer;
   performing a thermal anneal in an oxygen free environment; and
   forming a divot in the substrate by removing material formed by the thermal anneal.

2. The method of claim 1, wherein the thermal anneal selectively oxidizes silicon in an interface between the substrate and the spacer.

3. The method of claim 2, wherein the thermal anneal selectively oxidizes silicon according to the formula:

$$Si+Ge+2\ GeO_2 \rightarrow Ge+2\ GeO+SiO_2.$$

4. The method of claim 3, wherein removing the material comprises performing an isotropic etch.

5. The method of claim 4, wherein the isotropic etch removes silicon oxide formed at the interface between the substrate and the spacer.

6. The method of claim 5, wherein the isotropic etch comprises a hydrofluoric acid wet etch or dry etch.

7. The method of claim 3, wherein the thermal anneal results in a condensation of germanium at a surface of the substrate.

8. The method of claim 3, wherein forming the divot further comprises removing condensed germanium using a water solution.

9. The method of claim 1, wherein the divot directly contacts a base of the fin.

10. The method of claim 1, wherein the thermal anneal is performed in an inert gas environment.

11. A method for forming a semiconductor structure, the method comprising:
    forming a fin on a substrate, the fin comprising silicon and germanium;
    forming a shallow trench isolation (STI) layer over the substrate and on a sidewall of the fin;
    forming a mask over a first portion of the fin such that a second portion of the fin is uncovered;
    removing the uncovered portion of the fin, the remaining first portion of the fin defining a fin spike;
    forming a spacer comprising germanium oxide on the substrate, the spacer in direct contact with a sidewall of the fin spike;
    performing a thermal anneal in an oxygen free environment; and
    removing material formed by the thermal anneal.

12. The method of claim 11, wherein the thermal anneal selectively oxidizes silicon in an interface between the fin spike and the spacer.

13. The method of claim 12, wherein the thermal anneal selectively oxidizes silicon according to the formula:

$$Si+Ge+2\ GeO_2 \rightarrow Ge+2\ GeO+SiO_2.$$

14. The method of claim 13, wherein removing the material comprises performing an isotropic etch.

15. The method of claim 14, wherein the isotropic etch removes silicon oxide formed at the interface between the fin spike and the spacer.

16. The method of claim 15, wherein the isotropic etch comprises a hydrofluoric acid wet etch or dry etch.

17. The method of claim 13, wherein the thermal anneal results in a condensation of germanium in the fin spike.

18. The method of claim 17, wherein removing material formed by the thermal anneal further comprises removing the fin spike by removing condensed germanium in the fin spike using a water solution.

19. The method of claim 11, wherein removing the material results in forming a divot in a surface of the substrate.

20. The method of claim 11, wherein the thermal anneal is performed in an inert gas environment.

* * * * *